United States Patent [19]
Hubbell

[11] 4,027,299
[45] May 31, 1977

[54] SURFACE WAVE AUGMENTED LOOP MEMORY SYSTEM

[75] Inventor: Wayne C. Hubbell, Richardson, Tex.

[73] Assignee: The United States of America as represented by the Secretary of the Air Force, Washington, D.C.

[22] Filed: Nov. 12, 1975

[21] Appl. No.: 631,278

[52] U.S. Cl. .................................. 340/174 TF
[51] Int. Cl.² .................................. G11C 11/14
[58] Field of Search ....................... 340/174 TF

[56] References Cited
UNITED STATES PATENTS 3,836,897  9/1974  Marsh .................. 340/174 TF Primary Examiner—Vincent P. Canney
Attorney, Agent, or Firm—Joseph E. Rusz; Julian L. Siegel

[57] ABSTRACT

A magnetic domain memory system using single in-plane alternating magnetic fields augmented by surface elastic waves. Acoustic waveguides having bars of Permalloy elements interleaved on opposite sides of the waveguides are pulsed by surface acoustic waves generated by acoustic transducers at the ends of the waveguides. The alternating fields can be either perpendicular or parallel to the propagation direction of the magnetic domain bubbles and the interleaved Permalloy elements are positioned accordingly. Using a single alternating magnetic field, a pair of acoustic waveguides with associated surface wave transducers are configured in loops and aligned with one having the bubble propagation direction parallel and the other perpendicular to the alternating magnetic field. Current activated transfer gates are interposed between adjacent points of the two acoustic waveguides.

1 Claim, 5 Drawing Figures

SURFACE WAVE AUGMENTED LOOP MEMORY SYSTEM

STATEMENT OF GOVERNMENT INTEREST

The invention described herein may be manufactured and used by or for the Government for governmental pruposes without the payment of any royalty thereon.

BACKGROUND OF THE INVENTION

This invention relates to storage of binary data, and more particularly to the propagation of magnetic domains in acoustic surface waveguides.

The concept of using cylindrical magnetic domains in a sheet of magnetic material to store binary data for computer memories and to carry out logical operations is being vigorously pursued by many researchers. One of the problems associated with this concept is the necessary minipulation of these so-called magnetic bubbles. In particular, it is necessary to move the bubble about, from input port, to storage location, to readout port. In the present invention guided acoustic surface waves are used to augment field access magnetic bubble propagation. Several schemes have been suggested in the past to regulate the bubbles' positions, all of which involve the use of magnetic drive fields. These drive fields are supplied either by current flowing through a pattern of conductors or by one of the field access approaches. These field access approaches involve immersing the entire sheet in either a pulsating or rotating magnetic field that acts on the bubbles by means of carefully placed spots of magnetic material that concentrate the field. The disadvantage with conductor methods is that a great many accurately placed conductors whose dimensions are comparable to the size of the bubble must be interconnected with external-access circuits. On the other hand, the pulsing bias field access method requires oversize high-inductance coils which make high frequency operation difficult. Finally, the rotating in-plane field technique requires two orthogonal drive coils operating 90° out of phase. The need for two coils presents severe packaging problems and virtually eliminates internal access after assembly.

In addition to the manipulation of the bubble's position, it is also necessary to perform other processing functions, such as read and write, etc. To read the information, it is necessary to electronically detect the bubbles. A new system utilizing surface waves is presented that overcomes the need for bubble stretching required by other detection methods. There are two popular methods which utilize the bubbles stray fields already in existence. In the first method a Hall-effect sensor is placed on top of the magnetic crystal and if a bubble passes by, the Hall signal will be changed. In the second method the stray field of a bubble causes a change in resistance of a Permalloy element. Since the stray fields of a bubble are relatively weak, these effects are understandably small. Thus, the use of these techniques requires bubble stretching and complicated electronics to amplify and discriminate the "zero" bit from the "one".

SUMMARY OF THE INVENTION

The present invention discloses a system for guiding acoustic surface waves over domain supports to augment field access magnetic bubble propagation which regulates the bubbles' position. Either a pulsating or rotating magnetic field acts upon the bubbles by means of placing Permalloy elements on either side of the longitudinal axis of the support in order to centrate the field. The presence of the elastic wave traveling within the acoustic waveguide, when coupled with the reversing magnetic field, perpendicular to the surface wave propagation or parallel thereto, moves the bubble in one direction with each reversal of the alternating magnetic field.

It is therefore an object of this invention to provide a method and system for propagating and sensing magnetic domains without the need for bubble stretching.

It is another object to provide a method and system for propagating and sensing magnetic domains without the need for amplifying the effects of the domains.

It is still another object to provide a major-minor loop magnetic domain bubble memory that requires only one alternating in-plane magnetic field thus eliminating a second orthogonal field coil.

These and other objects, features and advantages of the invention will become more apparent from the following description when taken in conjunction with the illustrative embodiment in the accompanying drawings.

DETAILED DESCRIPTION OF THE PREFERRED EMBODIMENT

Figure 1:
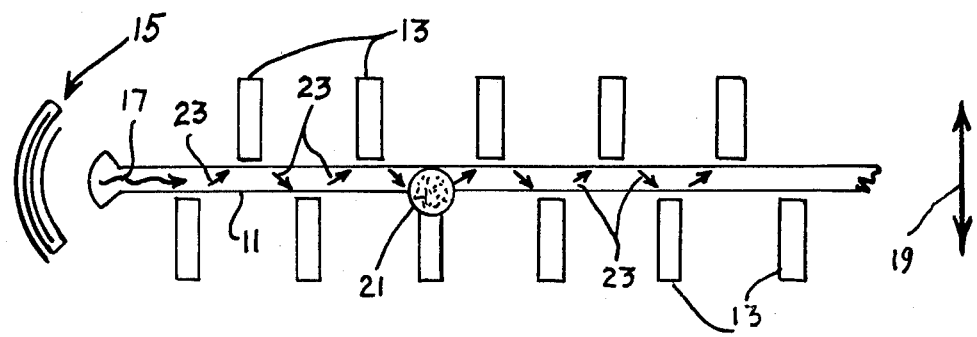
FIG. 1 is a schematic diagram showing a propagation system for magnetic domains using pulse surface waves where the direction of propagation is perpendicular to the in-plane alternating magnetic field.
Figure 2:
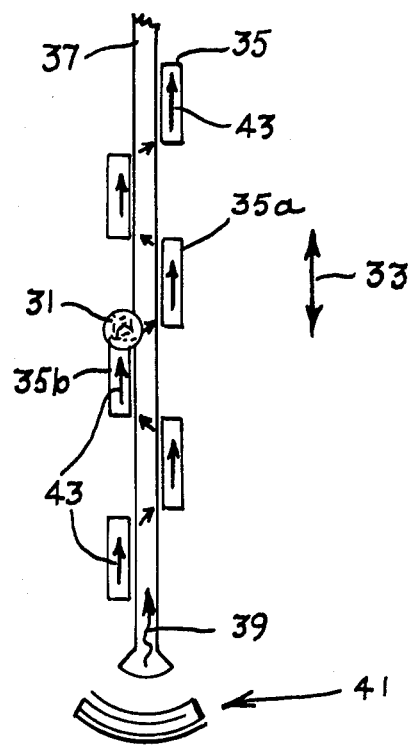
FIG. 2 is a schematic diagram showing a propagation system for magnetic domains using pulsed surface waves where the direction of propagation is parallel to the in-plane alternating magnetic field.

FIGS. 1 and 2 show two systems of surface waves aided propagation of magnetic domains. Both use pulse surface waves and a single in-plane alternating field together with a pattern of bars of Permalloy elements.

In FIG. 1, acoustic waveguide 11 is surrounded by a plurality of Permalloy elements 13 in form of bars and are interleaved on alternate sides of the acoustic waveguide 11 along its longitudinal direction with the bars being perpendicular to the longitudinal direction. Surface wave transducer 15 located at one extreme of acoustic waveguide 11 induces pulsed acoustic waves one of which is shown by arrowed wave 17. An alternating in-plane magnetic field is produced by any convenient source in the direction shown by arrow 19 and this field is perpendicular to the direction of propagation of the bubbles of the magnetic domains. Bubble 21 is alternately attracted to the poles of Permalloy bars 13 on opposite sides of surface waveguide 11. These poles change sign as the in-plane field reverses direction. Without acoustic wave 17, bubble 21 would be equally attracted to the nearest pole on the other side of waveguide 11 and could move either to the right or to the left. However, the presence of an elastic wave pulse with λ>d and synchronous with the reversing magnetic field, prevents the motion to the left and the bubble therefore moves generally to the right with step-wise motion as shown by arrows 21.

In FIG. 2, the motion of bubble 31 is parallel to the alternating in-plane magnetic field shown by arrow 33. Bubble 31 is attracted to the alternating poles of Permalloy elements 35 which are interleaved along the longitudinal direction of acoustic waveguide 37 and are positioned so that their longitudinal direction is parallel to the longitudinal direction of waveguide 37. When bubble 31 is in the position as shown, a field reversal causes it to be attracted to two poles, one to Permalloy bar 35a directly opposite to bubble 31 at the other side of the waveguide 37 and one at the opposite end of Permalloy bar 35b to which the bubble is attached. The presence of an elastic wave pulse shown by arrowed wave 39 generated by surface wave transducer 41 opposes the latter attraction and allows the bubble to move across waveguide 37. A subsequent field reversal and coincident pulse causes bubble 31 to advance to the opposite end of Permalloy element 35a to which it has just become attached. In this way bubble 31 achieves the step-wise motion shown by arrows 43. Thus, the techniques of both FIGS. 1 and 2 illustrate propagation in the same direction as the acoustic pulses travel, but require an alternating magnetic field in only one direction.

Figure 3:
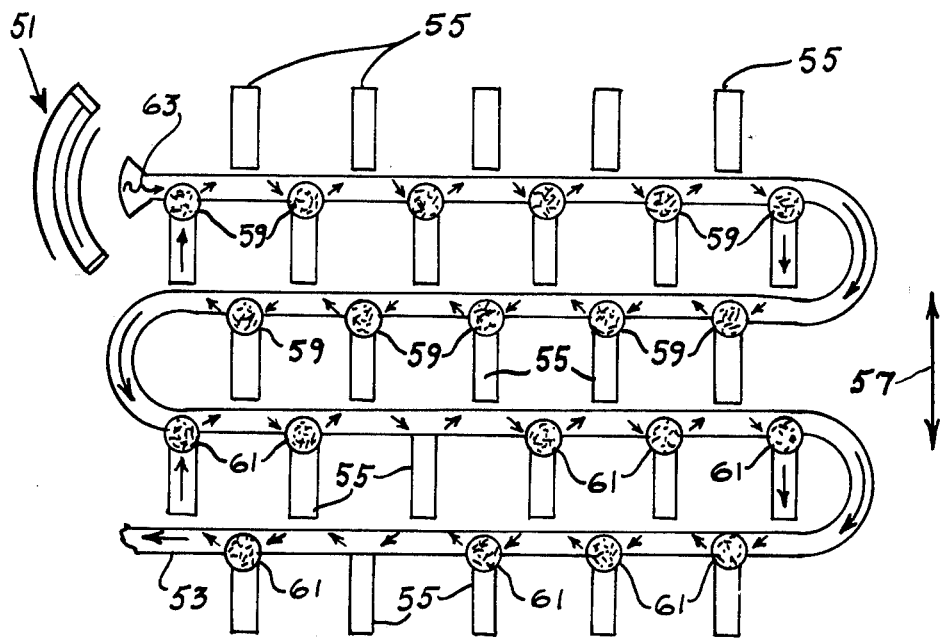
FIG. 3 is a schematic diagram showing minor loop elements of a bubble memory using the system of FIG. 1.

The first of these two methods of propagation can be incorporated into minor loop elements of a bubble memory as shown in FIG. 3 using transducer 51, acoustic waveguide 53, Permalloy elements 55, and alternating in-plane field 57. Here there are two minor loops with the upper loop being filled to capacity with bubbles 59 and the lower loop being only partially filled with bubbles 61. Only a single transducer is needed since the elastic waves 63 are guided around the serpentine path.

Figure 4:
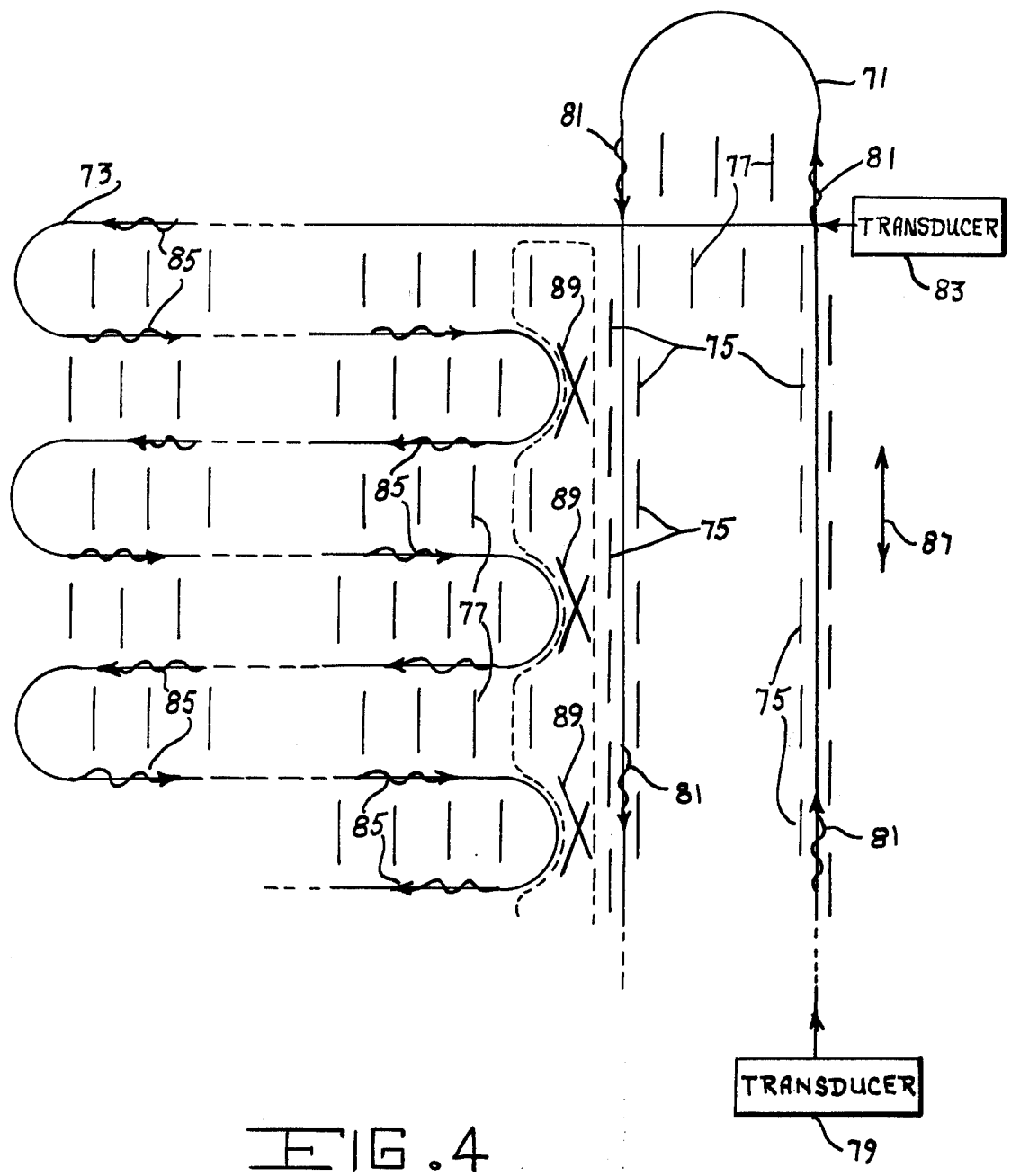
FIG. 4 is a schematic diagram showing a major loop element combining the system of FIGS. 1 and 2.

A combination of these two propagating techniques can be incorporated into a major/minor loop memory which is illustrated in FIG. 4. Here acoustic waveguide 71 is positioned adjacent to acoustic waveguide 73 and each being surrounded by interleaved Permalloy elements 75 and 77. Surface wave transducer 79 generates acoustic waves 81 in acoustic waveguide 71 while transducer 83 generates acoustic waves 85 in acoustic waveguide 73. Alternating magnetic field 87 is parallel to the direction of domain propagation for acoustic waveguide 71 and perpendicular to the direction of domain propagation for acoustic waveguide 73. Current actuated transfer gates 89 are placed at locations where the two acoustic waveguides are in proximity. Thus by activating a chosen transfer gate 89, appropriate bubbles can be transferred between the acoustic waveguides. This system has an advantage over conventional techniques in that it requires only one alternating in-plane field and eliminates the need for a second orthogonal field coil which makes bubble chip packaging simpler and improves chip access.

Figure 5:
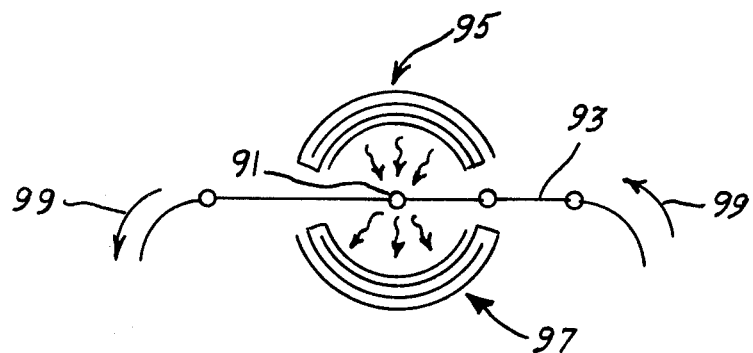
FIG. 5 is a schematic diagram showing the bubble detection circuit.

An improved bubble detector that can be used with acoustic waveguides is shown in FIG. 5. Its operation is based on achieving a resonant modulation of the diameter of bubble 91 as it passes through acoustic wave path 93 between the sending and receiving transducers 95 and 97. Propagation across this path as shown by arrows 99 could take place by either conventional or surface wave techniques. In order to achieve resonant modulation, the wavelength of the detecting surface wave must satisfy the condition, $n\lambda/2 = d$, where $n$ is an integer. When resonant modulation occurs, the sensing elastic waves are absorbed and the signal received at the other transducer is attenuated. Then as a stream of bubbles passes acoustic wave path 93, the receiver signal is "chopped" corresponding to the presence of bubbles in the path.

What is claimed is:

1. A propagating magnetic domain memory system comprising:
   a. a first acoustic waveguide;
   b. a first plurality of magnetic bars on opposite sides of the first acoustic waveguide with the bars on one side being interleaved with the bars on the other side;
   c. a first surface wave transducer at one extreme of the first acoustic waveguide for generating pulsed acoustic waves therein;
   d. a second acoustic waveguide being positioned to propagate magnetic domains in a direction perpendicular to that of the first acoustic waveguide and with selected points of the second acoustic waveguide being in juxtaposition with selected points of the first acoustic waveguide;
   e. a second plurality of magnetic bars on opposite sides of the second acoustic waveguide with the bars on one side being interleaved with the bars on the other side;
   f. a second surface wave transducer at one extreme of the second acoustic waveguide for generating pulsed acoustic waves therein;
   g. means for generating an alternating magnetic field in the plane of the first and second acoustic waveguides where the field is parallel to the propagating direction of one acoustic waveguide and perpendicular to the other acoustic waveguide;
   h. a plurality of current actuated transfer gates at the selected points of juxtaposition of the first and second acoustic waveguides.

* * * * *